United States Patent
Smick et al.

(10) Patent No.: US 8,324,599 B2
(45) Date of Patent: Dec. 4, 2012

(54) ION IMPLANTATION APPARATUS

(75) Inventors: Theodore H. Smick, Essex, MA (US); Joseph Daniel Gillespie, Boston, MA (US)

(73) Assignee: Twin Creeks Technologies, Inc., San Jose, CA (US)

(*) Notice: Subject to any disclaimer, the term of this patent is extended or adjusted under 35 U.S.C. 154(b) by 551 days.

(21) Appl. No.: 12/568,923

(22) Filed: Sep. 29, 2009

(65) Prior Publication Data

US 2011/0073779 A1 Mar. 31, 2011

(51) Int. Cl.
*H01J 37/317* (2006.01)

(52) U.S. Cl. ............... 250/492.21; 250/443.1

(58) Field of Classification Search ........... 250/443.1, 250/492.21

See application file for complete search history.

(56) References Cited

U.S. PATENT DOCUMENTS

| | | | |
|---|---|---|---|
| 4,733,091 A | | 3/1988 | Robinson et al. |
| 4,831,270 A | | 5/1989 | Weisenberger |
| 5,057,908 A | * | 10/1991 | Weber ............... 257/714 |
| 5,244,820 A | * | 9/1993 | Kamata et al. ........ 438/514 |
| 5,350,427 A | | 9/1994 | Freytsis et al. |
| 5,350,926 A | | 9/1994 | White et al. |
| 5,389,793 A | | 2/1995 | Aitken et al. |
| 5,834,786 A | | 11/1998 | White et al. |
| 6,677,594 B1 | * | 1/2004 | Young .............. 250/442.11 |
| 6,770,888 B1 | | 8/2004 | Benveniste et al. |

FOREIGN PATENT DOCUMENTS

WO 2004114356 12/2004

OTHER PUBLICATIONS

U.S. Appl. No. 12/494,272, filed Jun. 30, 2009, entitled "Ion Source Assembly for Ion Implantation Apparatus and a Method of Generating Ions Therein".
U.S. Appl. No. 12/494,268, filed Jun. 30, 2009, entitled "Ion Implantation Apparatus and a Method for Fluid Cooling".
U.S. Appl. No. 12/494,269, filed Jun. 30, 2009, entitled "Ion Implantation Apparatus".
U.S. Appl. No. 12/494,270, filed Jun. 30, 2009, entitled "Ion Implantation Apparatus and Method".
U.S. Appl. No. 12/122,108, filed May 16, 2008, entitled "Ion Implanter for Photovoltaic Cell Fabrication".
Office Action dated Aug. 9, 2012 for U.S. Appl. No. 12/894,229.

* cited by examiner

*Primary Examiner* — Kiet T Nguyen
(74) *Attorney, Agent, or Firm* — The Mueller Law Office, PC (57) ABSTRACT

An ion implanter has an implant wheel with a plurality of wafer carriers distributed about a periphery of the wheel. Each wafer carrier has a heat sink for removing heat from a wafer on the carrier during the implant process by thermal contact between the wafer and the heat sink. A respective wafer lift structure on each carrier is moveable between first and second positions, with the wafer supported spaced away from the heat sink and in thermal contact with the heat sink respectively. The lift structure is operated to move between the first and second positions wheel the implant is rotating. This allows control of wafer temperature during the implant process by adjusting the thermal contact between wafers and heat sinks.

18 Claims, 7 Drawing Sheets

ION IMPLANTATION APPARATUS

BACKGROUND

1. Field of the Invention

This invention relates to a method of implanting ions into a substrate wafer and an ion implantation apparatus for implanting ions into a substrate wafer. Example applications of the ion implantation method and apparatus include the separation or exfoliation of thin layers of crystalline semiconductor material, such as silicon, in the production of photovoltaic cells and in the production of Silicon on Insulator (SOI) wafers.

2. Background Information

Methods for exfoliation of thin layers of silicon have been developed which typically involve ion implantation of hydrogen and/or helium into a crystalline silicon substrate followed by annealing, under process conditions which facilitate substantially uniform shearing. For example, high implant doses, such as 7e16 atoms/cm$^2$ of hydrogen in the case of hydrogen implantation, are used. The implantation at high doses causes damage to the silicon crystal and with the post implantation annealing, the implanted layer creates internal pressure in the form of bubbles resulting in the fracture of the silicon crystal and exfoliation of the overlying silicon layer.

During implantation, damage to the silicon crystal is created in the form of lattice dislocations. Some damage at the end of range is required for the exfoliation process. However, in order to optimize performance in the resulting SOI or photovoltaic device, damage to the bulk silicon should be mitigated. Post implantation annealing is performed to reduce lattice dislocations. It is also known that implantation at higher temperatures reduces damage to the crystal during the implantation process. However, during implantation, the temperature of the silicon substrate is normally controlled to prevent premature exfoliation which may occur at temperatures of typically greater than 250° C.

Batch type ion implantation apparatus is known which allows for a batch of wafers to be processed simultaneously by mounting the wafers round the periphery of a process wheel mounted for rotation about an axis, so that the wafers on the wheel pass one after the other through a beam containing the ions to be implanted. The wafers are mounted on cooled wafer carriers. Such an apparatus thus enables a high current ion beam to be used which increases throughput whilst maintaining the temperature of the wafers within an acceptable range. Thus, there are known arrangements for cooling the wafers to an acceptable temperature range, but there remains a need to control the temperature of the silicon substrate during ion implantation to improve the process.

BRIEF SUMMARY OF THE INVENTION

One aspect of the invention provides a method of implanting ions into a substrate wafer comprising the steps of mounting the substrate wafer onto a carrier containing a heat sink for removing heat from said wafer during an ion implantation process by thermal contact between said wafer and said heat sink, initiating the ion implantation process so that ions are implanted into said wafer mounted on the carrier, and during said ion implantation process selectively adjusting said thermal contact between said wafer and said heat sink, to control heat removal from said wafer.

The step of selectively adjusting said thermal contact may be performed by selectively adjusting the relative position of said wafer on said carrier and said heat sink, between a spaced apart position and a thermal contact position. In an example of an embodiment of the invention, a first part of the ion implantation process may be performed with said wafer in said spaced apart position.

In an example of an embodiment of the invention, the wafer is planar and the carrier is rotated during said ion implantation process about an axis which is angled relative to a normal to said wafer on said carrier and which is spaced from said wafer so that a centrifugal force is exerted on said wafer which has a component urging said wafer towards said heat sink. In addition, the wafer may be urged on said carrier towards said spaced apart position from said thermal contact position by an urging force which exceeds said component of said centrifugal force at rotational speeds of said carrier about said axis up to a transition speed, and said relative position of said wafer and said heat sink is selectively adjusted between said spaced apart position and said thermal contact position by adjusting said rotational speed during said ion implantation process between speeds below and above said transition speed.

In another aspect, the invention provides ion implantation apparatus for implanting ions into a substrate wafer comprising a wafer carrier containing a heat sink for removing heat from a wafer on said carrier during an ion implantation process by thermal contact between said wafer and said heat sink; and a wafer lift structure mounted on said wafer carrier and operable during said ion implantation process while ions are being implanted to adjust said thermal contact between said wafer and said heat sink to control heat removal from said wafer.

The wafer lift structure may be operable to move said wafer on said carrier relative to said heat sink between a spaced apart position and a thermal contact position.

In a further aspect, the invention provides ion implantation apparatus for implanting ions into planar substrate wafers, comprising an implant wheel mounted for rotation about a wheel axis; a plurality of wafer carriers distributed about a periphery of said implant wheel; a respective heat sink in each said wafer carrier for removing heat from a wafer on said carrier during an ion implantation process by thermal contact between said wafer and said heat sink; and a respective wafer lift structure on each said wafer carrier which is movable between a first position with said wafer supported spaced away from said heat sink and a second position with said wafer in contact with said heat sink, wherein each said lift structure is operable to move between said first and second portions when said implant wheel is rotating.

In an example of an embodiment of the invention, said wafer carriers are each adapted to support respective said wafers canted by a predetermined cant angle inwards towards said wheel axis so that, when said implant wheel rotates about said axis, a centrifugal force urges each said wafer on a respective said carrier towards said respective heat sink.

Each said lift structure may be responsive to centrifugal force to move between said first and second positions as the speed of rotation of said implant wheel is varied. In addition, each said lift structure may be adapted to move said respective lift structure to bring said wafer into contact with said heat sink when said implant wheel is rotating at speeds in excess of a transition speed. In an example of an embodiment of the invention, the ion implantation apparatus may further comprise a drive motor for the implant wheel and a speed controller for said drive motor, wherein said speed controller is arranged to control said drive motor to rotate said implant wheel while implanting ions into said wafers on said carriers at rotation speeds in excess of a minimum process rotation speed, and each said lift structure is adapted such that said transition speed of the implant wheel is higher than said minimum process rotation speed.

Each said lift structure may comprise inner and outer fence arms mounted on said respective wafer carrier, said inner fence arm providing an inner fence at a radially inner edge of said carrier relative to said wheel axis to support an inner edge of said wafer on said carrier and said outer fence arm providing an outer fence at a radially outer edge of said carrier to support an outer edge of said wafer on said carrier. Said inner and outer fences may further support at said inner and outer edges an underside of said wafer facing said heat sink. Each of said inner and outer fence arms may be pivoted on said wafer carrier to provide movement of the respective said fence transverse to the plane of a wafer on said carrier to provide movement between said first and second positions. In addition, said fence arms may be pivoted such that centrifugal force from rotation of said implant wheel acts on said fence arms to urge the respective said fences towards said second position.

In an example of an embodiment of the invention, each said lift structure includes at least one spring urging said fence arms towards said first position.

Said ion implantation process and said ion implantation apparatus may be operative to deliver an average power to the wafer of at least 50 watts or at least 200 watts.

BRIEF DESCRIPTION OF THE DRAWINGS

Examples of the invention will be described below with reference to the accompanying drawings, in which.

DETAILED DESCRIPTION OF THE INVENTION

Figure 1:
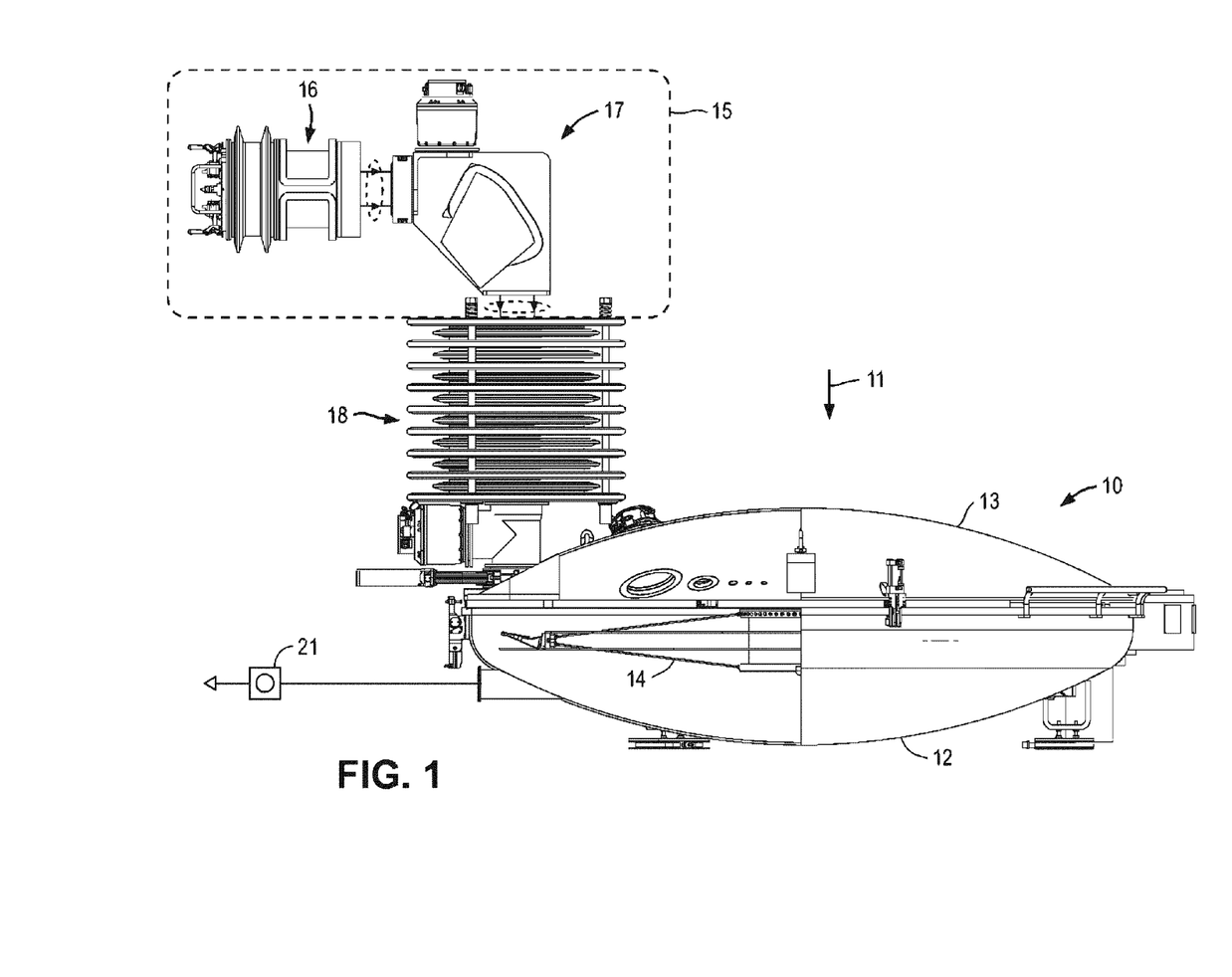
FIG. 1 is a schematic view in elevation and partially cut away, of an ion implanter embodying the present invention.

FIG. 1 is a schematic illustration of ion implantation apparatus which is an embodiment of the present invention. Ion implantation is conducted in a vacuum environment and the main operative features of the embodiment are contained within a vacuum chamber. In the illustrated embodiment in FIG. 1, the vacuum chamber is shown in three interconnected parts. The first part is a process chamber 10 which has a circular profile when viewed from above in FIG. 1 along the direction of arrow 11. The process chamber 10 comprising a part spherical lower wall section 12 and an opposed part spherical upper wall section 13, forming a disc shaped vacuum enclosure which is thickened at the center of the disc. This process chamber 10 contains a process wheel or implant wheel 14 extending in the plane of the disc chamber 10 for rotation about a vertical axis aligned substantially with the center of the disc. Wafer substrates for processing are carried in the process chamber 10 about the periphery of the implant wheel 14, as will be described and illustrated later in greater detail.

A second part of the vacuum chamber is contained in a high voltage enclosure 15 and is constituted by an ion source structure 16 and a mass selection magnet structure 17. A beam of ions desired for implantation (in one embodiment, $H^+$ ions) is produced in the ion source structure 16 and directed into the magnet structure 17. The magnet structure 17 is effective to bend the ion beam, allowing unwanted ions in the beam to be filtered from the continuing beam which is directed towards the process chamber 10. Ion source and mass selection structures 16 and 17 are well known and will not be described in greater detail herein. For example, U.S. patent application Ser. No. 12/494,269 to Ryding assigned to the assignee of the present invention describes an ion source and mass selection structure and the disclosure of this US patent application is incorporated herein by reference in its entirety for all purposes A third part of the vacuum chamber is constituted by an accelerator tube 18 which interconnects the high voltage part of the vacuum chamber within the high voltage enclosure 15 and the process chamber 10. The accelerator tube 18 comprises an electrically insulating element to allow the ion source and mass selection structures 16 and 17 to be held at a very high voltage relative to the process chamber 10. Electrodes contained in the accelerator tube are electrostatically biased to accelerate the ion beam directed from the mass selection structure 17 to the required implant energy for delivery to the process chamber 10. All parts of the vacuum chamber are pumped down by one or more vacuum pumps, one of which is shown schematically in FIG. 1 at 21.

Figure 2:
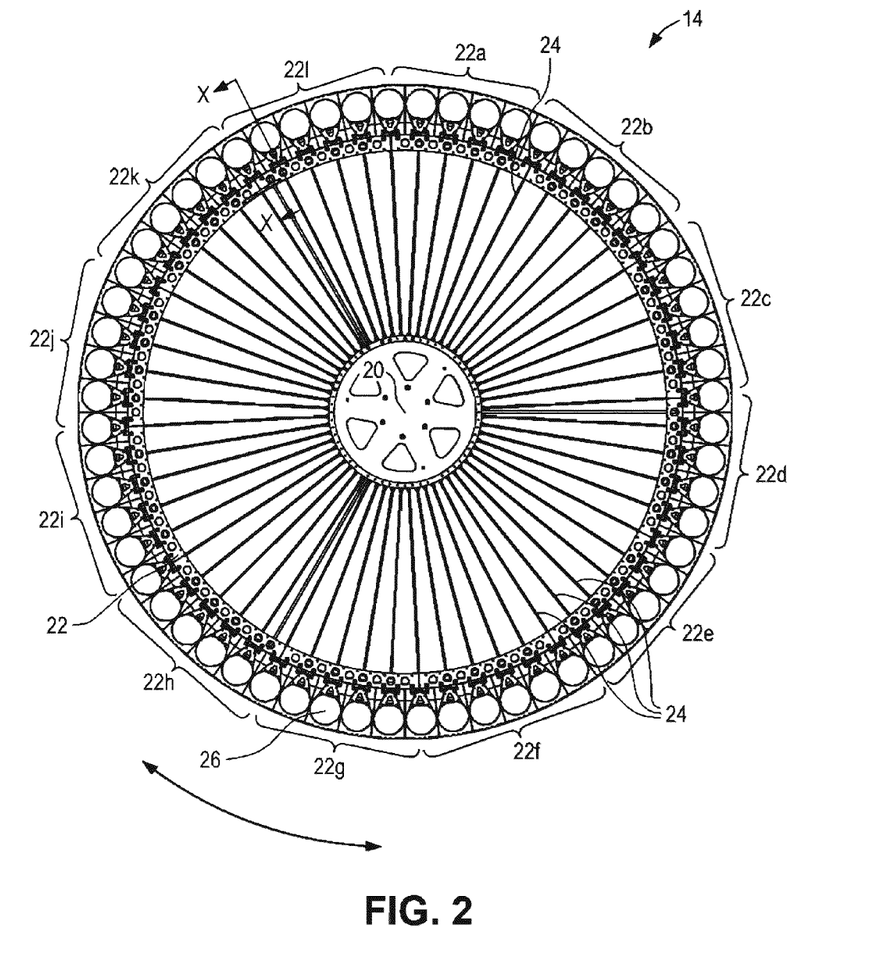
FIG. 2 is a plan view of the implant wheel of the ion implanter of FIG. 1.

Turning now to FIG. 2, a plan view of the implant wheel 14 is shown. The implant wheel comprises a hub 20 and a rim 22 connected to the hub 20 via a plurality of spokes 24. The rim 22 is formed as a plurality (twelve in this embodiment) of segments 22a, 22b . . . 22l each of which form, in the embodiment of FIG. 2, a 30° arc of the rim.

Each segment of the rim 22 in turn carries a plurality of equidistantly spaced substrate supports or wafer carriers 26, extending radially outwardly from the rim segments. This plurality may be five, as in FIG. 2; so that the implant wheel 14 of FIG. 2 thus carries 60 wafer carriers 26 around the rim 22. Each of the wafer carriers 26 provides a wafer support surface which is shaped and sized to match or be similar to the substrate wafer to be processed. For example, if the substrate wafer to be processed is a 150 mm circular wafer, the support surfaces of the supports 26 are made of similar size and shape and the diameter of the implant wheel is such as to provide a peripheral circumference of at least 60×150 cm so that the 60 supports (and 60 wafers on the supports) are accommodated around the implant wheel periphery without overlapping. Instead of 150 cm circular support surfaces, other shapes and sizes may be provided to accommodate other wafer shapes and sizes, but in each case, the implant wheel is formed with a peripheral circumference of at least N*a where N is the number of wafer supports and a is the smallest width of the wafer substrates to be processed. If the wafers are circular, a is the diameter.

A characteristic of the embodiment is that there are at least 50 (60 in this example) wafer supports 26 on the implant wheel and the ion source and mass selection magnet structures 16 and 17 in combination with the accelerator tube 18 provide an ion beam directed at wafers on the carriers 26 of the implant wheel which has an energy of at least 200 keV and an ion current of at least 30 mA. Then the power delivered to wafers by the beam is at least 6 kW. By ensuring the implant wheel can accommodate at least 50 wafers at the same time, spinning the wheel during processing allows this beam power to be shared between the wafers on the wheel so that each wafer receives only as much power as can be dissipated or removed without overheating and damaging the wafer.

Referring again to FIG. 2, the spokes 24 may have a dual purpose. Firstly, they may extend between the hub 20 and the rim 22 under tension. By holding the spokes 24 under tension, the 12 segments 22a-22l of the rim 22 are drawn towards the hub 20 and compress together circumferentially. Thus the rim 22 is stiffened rotationally by the tension in the spokes 24. Note that, in the embodiment, the spokes 24 are equally spaced around both the hub 20 and rim 22, and, are aligned radially. If it is desired to increase the rotational stiffness of the process wheel 14, then stiffener plates may be employed. Alternatively, bracing bars may be provided extending non-radially between the hub 20 and the rim 22. A symmetrical arrangement of six such bars can be tensioned to provide torsional stiffness in both rotational directions. In another embodiment, torsional stiffness is provided by non-radial alignment of the spokes 24 to form an interlaced pattern in the fashion of a wire-spoked bicycle wheel.

The second possible purpose of the spokes is to facilitate the channeling of cooling fluid from outside of the disc shaped vacuum enclosure, via the hub 20, to the rim 22 by way of spokes 24 in embodiments in which the carriers 26 are arranged to be cooled. Cooling fluid is then channeled at the rim to each carrier 26 so as to provide cooling for wafers mounted on the carrier 26, during implantation. In an embodiment, the spokes 24 are arranged so that a pair of spokes extend between the hub 20 and each carrier 26: one spoke of the pair carries cooling fluid between the hub and a carrier 26 in a first direction (e.g., hub to rim), and the other spoke of the pair carries cooling fluid between the hub 20 and the carrier 26 in the opposite direction (e.g., rim to hub).

Figure 3:
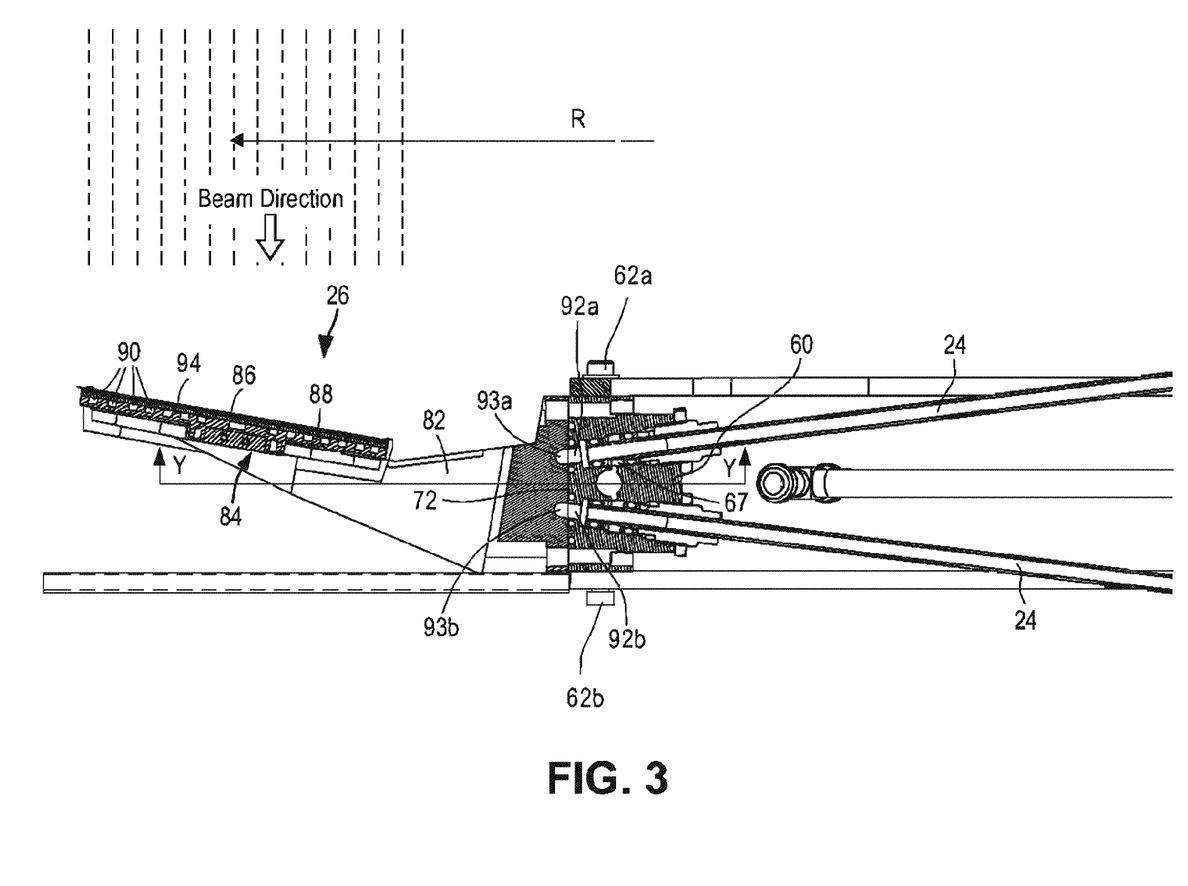
FIG. 3 is a view in elevation and in section of the rim of the implant wheel of FIG. 2 together with a wafer carrier mounted thereon.

Turning now to FIG. 3, a section through the implant wheel 14 along the line X-X of FIG. 2 is shown. This represents a close-up section through the rim 22 of the implant wheel 14 and a carrier 26. As shown in FIG. 3, the spokes 24 of the pair extend to the carrier 26 in substantially the same plane, with one spoke above the other. This allows cooled fluid to be channeled from outside the process chamber 10, via the hub 20, to the rim (through the upper spokes 24, for example) and from there to the carriers 26, where heat caused by ion implantation into wafers upon the carriers 26 is conducted into the cooling fluid. Then the (heated) cooling fluid circulates back to the rim 22 and is taken away via the (lower) spokes 24 (in this example), back to the hub 20 and then away from the process chamber 10 to be recycled or discarded.

The manner in which the carriers 26 are cooled and the manner in which the (stationary) cooling fluid supply and return lines (not shown in the Figures) are connected to the hub 20, which of course rotates in use, do not form a part of the present invention and thus are not described further herein. More details concerning an example implementation for cooling the carriers 26 is provided in the aforementioned U.S. patent application Ser. No. 12/494,269 to Ryding. Other known cooling techniques may instead be used.

The rim 22 is formed as segments 22a . . . 22l of an annulus, as is best seen in FIG. 2, and provides mechanical support for the spokes 24. Extending around the circumference of the rim 22 is a plurality of mounting blocks 60, shown in FIG. 3. Each mounting block 60 is affixed at an upper and lower surface to the rim 22. Each mounting block 60 is generally rectilinear with a major axis extending in the circumferential direction of the rim 22. Each mounting block 60 is, however, spaced circumferentially from adjacent mounting blocks: that is, the major axis of each block 60 extends over less than 360/N degrees of arc, where N is the number of substrate supports (60 in the example of FIG. 2). As seen in FIG. 3, each mounting block 60 is affixed to one of the segments 22a . . . 22l of the rim 22 using screws 62a, 62b. Alternatively, the mounting blocks 60 could be welded to the rim segments 22a . . . 22l.

A radially outwardly directed face of each mounting block 60 forms a carrier mounting face 72 to which a carrier arm 82, having a radially inwardly directed planar mounting face, registers and is secured by appropriate bolts (for example) to the mounting face 72 of the respective mounting block 60.

The end of the carrier arm 82, distal from the mounting block 60, carries a respective wafer carrier 26 for supporting a substrate wafer 86. The carrier 26 contains a heat sink for removing heat from the wafer 86 during an ion implantation process by thermal contact between the wafer and the heat sink. The carrier 26 further has a wafer lift structure mounted thereon which is operable during the ion implantation process while ions are being implanted to adjust the thermal contact between the wafer and the heat sink to control heat removal from the wafer. In an embodiment, the wafer lift structure is movable so that the relative position of the wafer on the carrier 26 can be adjusted between a spaced apart position and a thermal contact position. In an example arrangement as will be described in more detail below, the lift structure is operable to move between a first position, with the wafer supported spaced away from the heat sink, and a second position, with the wafer in contact with the heat sink, when the implant wheel is rotating. The lift structure may be arranged to be responsive to centrifugal force when the implant wheel is rotating to move between the first and second positions as the speed of rotation of the implant wheel is varied. An example carrier and wafer lift structure in accordance with an embodiment of the invention is more clearly shown in FIGS. 4, 5, 6a, 6b and will be described in more detail below.

Figure 4:
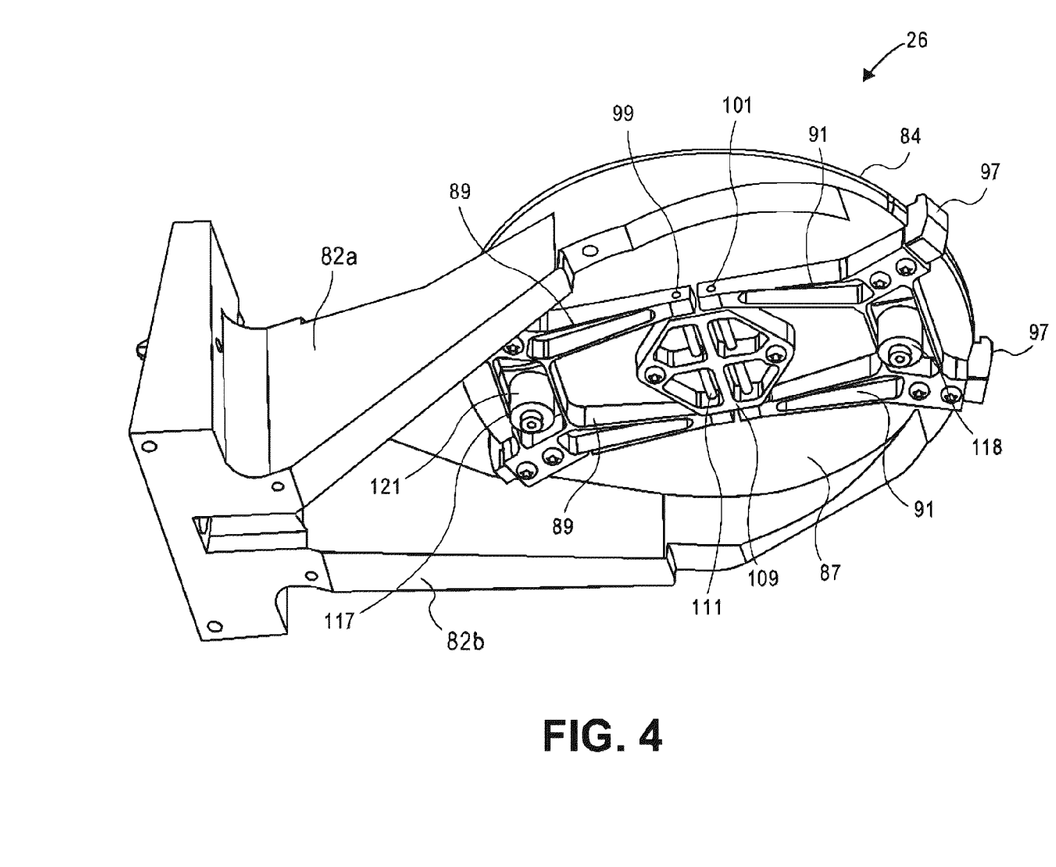
FIG. 4 is an enlarged back side view of a wafer carrier together with a wafer lift structure mounted thereon in accordance with an embodiment of the invention.
Figure 5:
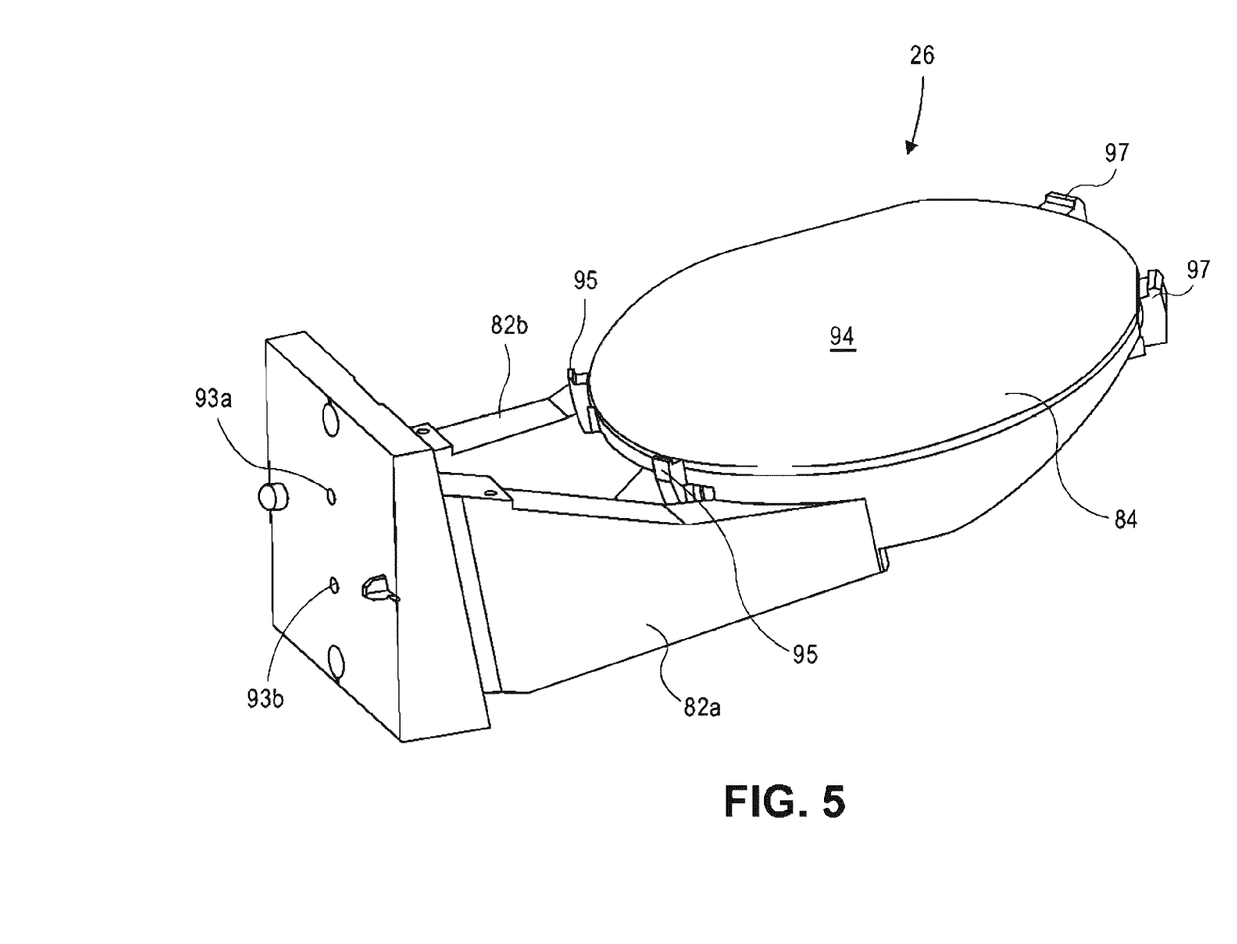
FIG. 5 is an enlarged front side view of the wafer carrier together with a wafer lift structure mounted thereon in accordance with the embodiment of the invention.

As shown in FIGS. 3, 4 and 5, this carrier 26 may comprise a pedestal 84 for supporting a wafer 86. An upper surface 94 of the pedestal 84 may be covered in an elastomeric thermally conductive material 88, such as Room Temperature Vulcanizing (RTV) silicone rubber. As best seen in FIG. 3, below the upper surface 94 of the pedestal 84 there are formed a plurality of cooling channels 90. These channels 90 communicate, via internal fluid passages (not shown) in the arm 82 of the substrate support 26, to the radially inwardly directed mounting face of the carrier 26. These cooling passages in the arm 82 register by means of openings 93a and 93b with respective passages 92a and 92b in the support mounting face 72 of the block 60. The passages 92a and 92b connect to the ends of the tubular spokes 24 so as to carry cooling fluids between the carrier 26 and the hub 20 as described above. The heat sink of each of the carriers 26 may therefore be provided by the conductive path provided by the thermally conductive material 88 formed on the pedestal 84 and, when used, also the cooling fluids carried to and from the carrier 26 via the cooling channels 90. It will however be appreciated that it is not intended to limit the invention to the particular heat sink arrangement shown in the Figures and alternative heat sink arrangements would be readily apparent to a person skilled in the art.

As further shown in FIGS. 4 and 5, the carrier arm 82 comprises two arm portions 82a and 82b. When the carrier arm 82 is secured to the mounting block 60, the arm portions 82a and 82b extend outwardly from the mounting block and are arranged so that the ends of the arm portions, distal to the mounting block 60, engage an underside face 87 of the pedestal 84 so as to support the pedestal 84. As shown in FIG. 4, each end of the two arm portions 82a, 82b engage the underside face 87 of the pedestal at opposing edges of the pedestal 84.

In an embodiment, the carrier arm 82 (and thus the arm portions 82a, 82b) is arranged to cant the carrier 26 at a predetermined cant angle inwards toward the vertical implant wheel axis (best shown in FIG. 3) so that, because the wheel axis is spaced from said wafers, when the implant wheel rotates about the vertical axis in a horizontal plane, a centrifugal force is exerted on the wafers and the centrifugal force or a component of the centrifugal force urges the wafer 86 onto the respective carrier 26 and as will be described in more detail below, towards the heat sink. In other words, as the implant wheel rotates, a centripetal force is exerted on the wafers 86 by the pedestals 84 because of the aforementioned cant angle. In an example, the wafers may be angled at approximately 80° to the vertical wheel axis (i.e. 10° to the plane of the implant wheel 14), so that the wheel axis is angled relative to a normal to the wafers by about 10°.

The wafer lift structure on each carrier 26 is responsive to centrifugal force generated on rotation of the implant wheel 14 to move between a first position with the wafer supported spaced apart or away from the heat sink in the pedestal 84 and a second position with the wafer in thermal contact with the heat sink in the pedestal 84. The wafer lift structure provides an urging force which is greater than the centrifugal force exerted on the wafer at rotation speeds up to and including a transition speed which urging force urges the wafer to the spaced apart position. The wafer lift structure is adapted to bring the wafer in thermal contact with the heat sink when the implant wheel is rotating at speeds in excess of a transition speed. In other words, by adjusting the rotational speed of the implant wheel, the wafer lift structure can adjust the relative position of the wafer with respect to the heat sink in the pedestal 84 and thereby adjust the thermal contact between the wafer and the heat sink.

Figure 6A:
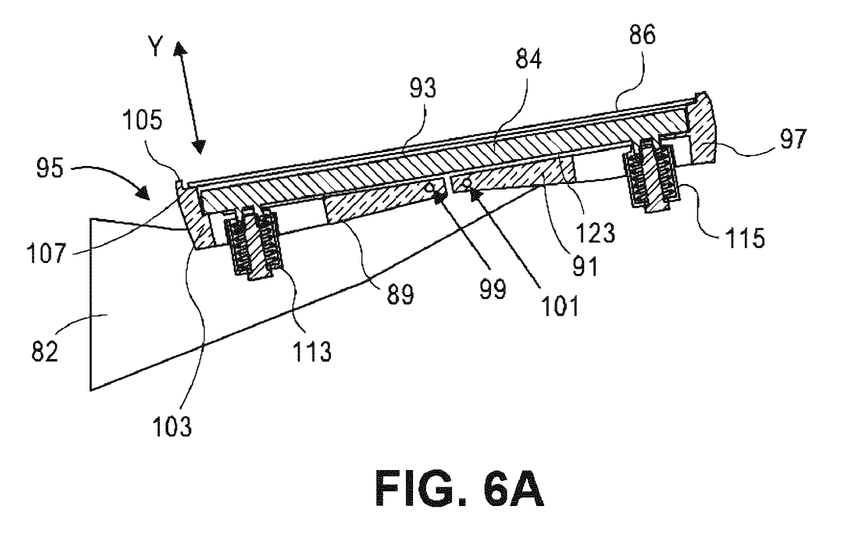
FIG. 6a is an enlarged schematic cross sectional view of the wafer carrier and the wafer lift structure of FIG. 4 with the wafer lift structure in a first position to position a wafer in a spaced apart position.
Figure 6B:
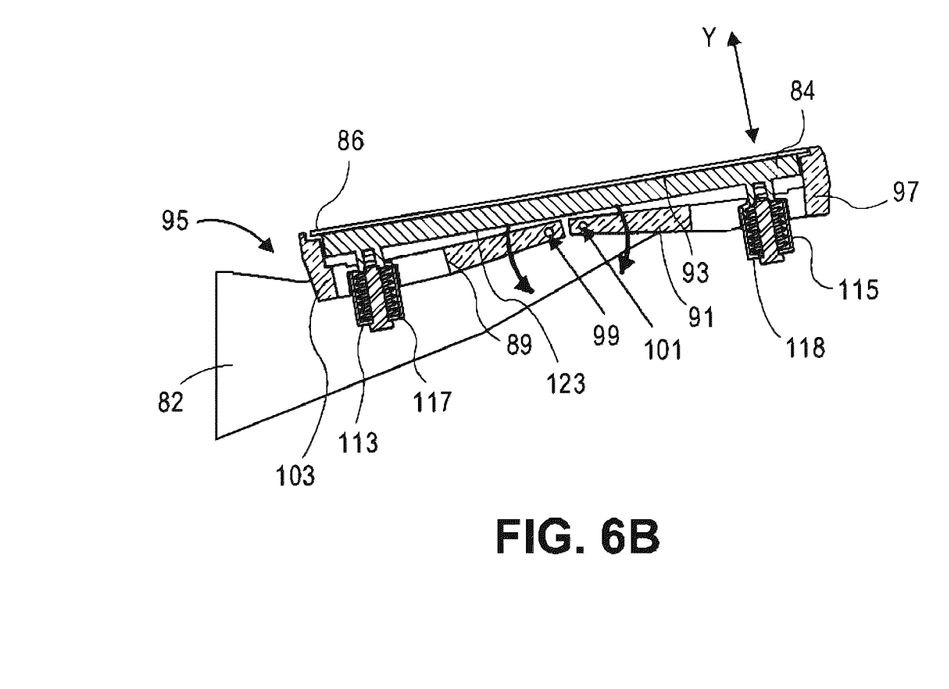
FIG. 6b is an enlarged schematic cross sectional view of the wafer carrier and the wafer lift structure of FIG. 4 with the wafer lift structure in a second position to position a wafer in a thermal contact position.

Referring to FIGS. 4 and 5, an example wafer lift structure comprises inner 89 and outer 91 fence arms mounted under the pedestal 84 of the carrier 26. The inner fence arm 89 provides an inner fence 95 at a radially inner edge of the carrier 26 relative to the wheel axis to support an inner edge of a wafer 86 (not shown in FIGS. 4 and 5 for simplicity) on the carrier 26. The outer fence arm 91 provides an outer fence 97 at a radially outer edge of the carrier 26 to support an outer edge of the wafer 86 on the carrier 26. As more clearly seen in FIGS. 6a and 6b, the inner 95 and outer 97 fences further support at the inner and outer edges an underside of the wafer 86 facing the heat sink (e.g. facing the upper surface 94 of the pedestal 84 on which is formed the thermally conductive material). The inner 89 fence arm 89 is pivoted about a pivot point 99 and the outer fence arm 91 is pivoted about a pivot point 101. Pivotting of the fence arms 89 and 91 provides movement of the respective fences 95 and 97 along the direction Y as shown in FIGS. 6a and 6b, transverse to the plane of a wafer on the carrier 26. In FIG. 6a, the fences 95 and 97 are in the first position supporting the wafer spaced apart from the pedestal 84, and in FIG. 6b, the fences 95 and 97 are in the second position with the wafer in thermal contact with the pedestal 84.

In the embodiment shown in the Figures, the wafer lift structure has four fences: two inner fences 95 are provided at the inner edge of the carrier 26 and two outer fences 97 are provided at the outer edge of the carrier. Having four fences facilitates the correct positioning of the wafer on the carrier 26 before and during an ion implantation process but other arrangements of fences may alternatively be used (e.g. only two opposing fences).

The inner fence arm 89 extends from the pivot point 99 on the underside of the carrier 26 to an inner edge of the carrier, and around the inner edge of the carrier 26 to provide an inner fence wall 103. The inner fence wall 103 has an upper edge providing a support surface 107 to engage an underside of wafer 86 proximate an inner edge of the wafer. An inner fence ridge 105 extends upwards from said support surface 107 to locate the inner edge of wafer 86. As shown in FIG. 4, the inner fence arm 89 is pivotally coupled to the carrier 26 at the backside of the pedestal 84 on a shaft 111 supported on a fixing 109.

The outer fence arm 91 has a similar structure to that of the inner fence arm 89 described above. The outer fence arm extends to and around the outer edge of the carrier 26 so as to provide an outer fence wall having a corresponding upper edge providing a support surface and an outer fence ridge to support the outer edge of the wafer.

The wafer lift structure in accordance with an embodiment further comprises at least one spring for providing an urging force to urge the inner 89 and outer 91 fence arms so that the inner 95 and outer 97 fences move along the direction Y. For example, the at least one spring is arranged to urge the inner 95 and outer 97 fences upwards (in FIGS. 6a and 6b) relative to the pedestal 84 to a first position. In the first position, the fences 95 and 97 support the wafer 86 in a spaced apart position above the upper surface 94 of the pedestal 84. In other words, the wafer 86 is lifted off the upper surface 94 of the pedestal 84 by the movement of the fences 95 and 97 to the first position. In the example arrangement shown in the Figures, the wafer lift structure comprises an inner spring arrangement 117 which includes a spring 113 for controlling the movement of the inner fence arm 89 and an outer spring arrangement 118 which includes a spring 115 for controlling the movement of the outer fence arm 91.

Figure 7:
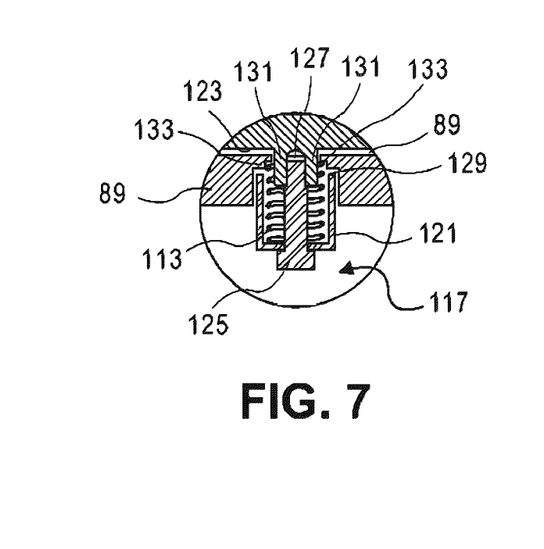
FIG. 7 is an enlarged schematic cross sectional view showing part of the lift structure of FIGS. 6a and 6b in greater detail.

FIG. 7 shows an enlarged view of spring arrangement 117. The outer spring arrangement 118 may have a similar arrangement.

The spring arrangement 117 comprises the spring 113 positioned within a housing 121 which is attached to an underside surface 123 of the pedestal 84 via a screw or plug 125. The screw or plug 125 extends through the housing 121 and the center of the spring 113 and securely mates with a seat 127 provided in the underside surface 123 of the pedestal 84. In the arrangement shown in FIG. 7, the seat 127 is arranged to extend from the underside surface 123 of the pedestal 84 and comprises a wall 131 that extends from the underside surface 123 of the pedestal to define an opening for receiving the screw 125. The spring 113 is attached to the housing 121 at an end distal from the pedestal 84 and the housing 121 has an open end 129 adjacent the underside surface 123 of the pedestal 84. The spring 113 extends from the open end 129, surrounds the wall 131 of the seat 127, and bears on a radially inwardly projecting flange 133 formed in the inner fence arm 89. In this embodiment, the spring 113 therefore provides an urging force tending to push the inner fence arm 89 upwards towards the underside surface 123 of the pedestal 84. This results in the inner fences 95 being moved to the first position. Similarly, spring 115 in spring arrangement 118 moves outer fence 97 to the first position. With the fences 95 and 97 in the first position, the wafer 86 is spaced apart from the heat sink of the carrier 26 as shown in FIG. 6*a*.

When the fences 95 and 97 are in the first position as shown in FIG. 6*a*, the wafer 86 is spaced apart from the heat sink. In this spaced apart position, wafer 86 can be loaded and unloaded from the carrier 26 and thus, the spaced apart position may represent the loading and unloading position.

Each of the fence arms 89 and 91 is arranged so that the center of mass of the respective fence arm is positioned with respect to its pivot point so that, when the implant wheel rotates, each fence arm is encouraged by centrifugal force to pivot against the urging of springs 113 and 115, so as to move the wafer onto the heat sink as shown in FIG. 6*b*. However, due to the urging force provided by the springs, the moving of the wafer into contact with the heat sink only occurs when the centrifugal force on the fence arms and the wafer exceeds the urging force provided by the springs, which is designed to occur when the rotational speed exceeds the aforementioned transition speed.

It is clear that the transition speed is determined by the choice of spring force, the mass of the fence arms and the location of the pivot point. The dimensions of the fence arms and spring can be determined readily by analysis.

It will be appreciated that spring arrangements other than that described in detail above may be used. The arrangements described above use springs in compression, and alternative arrangements can be devised readily using springs in extension.

Figure 8:
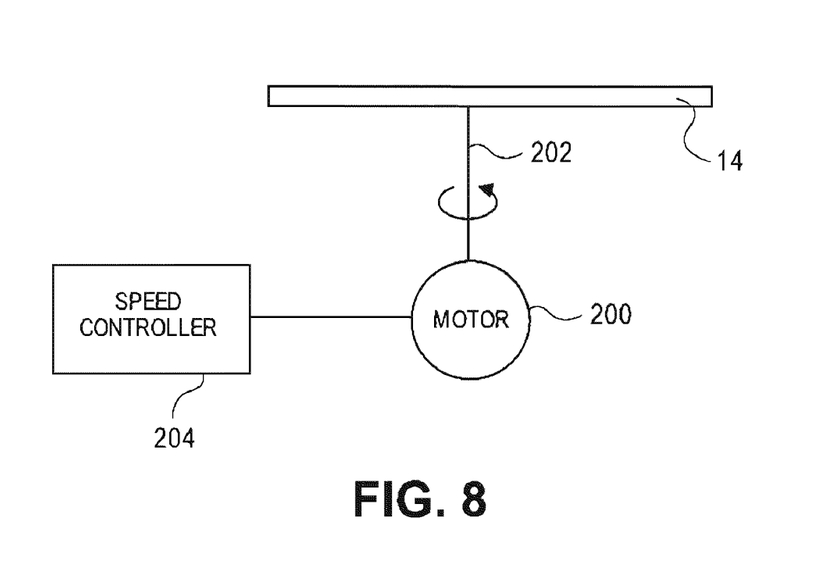
FIG. 8 is a block schematic diagram showing a drive motor and speed controller for controlling the rotation of the implant wheel of FIG. 2 in accordance with an embodiment of the invention.

FIG. 8 illustrates schematically an arrangement by way of example by which the speed of rotation of the implant wheel can be adjusted so as to adjust the relative position of the wafer with respect to the heat sink during an ion implantation process. Although not shown in FIG. 1, the ion implantation apparatus comprises a drive motor 200 coupled to the implant wheel 14 via a drive shaft 202 for rotating the implant wheel 14. A speed controller 204 is coupled to the drive motor 200 and is arranged to control the drive motor 200 to rotate the implant wheel while implanting ions into the wafers on the carriers 26. During ion implantation into the wafers on the carriers 26, with the ion beam directed onto the periphery of the implant wheel 14, the wheel should be rotated at speeds sufficient to spread the power of the beam among all the wafers on the carriers 26, and to limit localized differential heating of each wafer as the beam sweeps over the wafer. For beam powers up to about 12 kW, a minimum rotational speed of the implant wheel of about 20 r.p.m is sufficient for a wheel carrying 60+ wafers of 150 mm in diameter. Higher beam powers may require a higher minimum rotation speed. The speed controller 204 is arranged to vary the rotation speed so that during an ion implantation process, the rotation speed of the implant wheel is at least one rotation speed greater than said minimum rotation speed and up to the transition speed for a first period of time and the rotation speed is at least one rotation speed greater than the said transition speed for a second period of time. In an example, the transition speed may be about 80 rpm.

During the ion implantation process, the temperature of a wafer varies within the wafer both across the wafer in the major dimension of the wafer and through the wafer in the minor dimension of the wafer. Temperature variations across a wafer 86 can be due to varying geometry between the cooling channels 90 in the pedestal 84 which supports the wafer 86 and to variations in contact force between the wafer 86 and the thermal conductive material 88 on the upper surface 94 of the pedestal 84 which may be due to variations in flatness of the wafer 86 and pedestal 84. Temperature variations through the wafer can be due to the period of time over which the ion beam is applied to the surface of the wafer and the time the wafer takes to conduct the heat away. The latter temperature variations are a function of the diameter of the implant wheel, ion beam power and rotation speed of the implant wheel.

By varying the rotation speed of the implant wheel during an ion implantation process, the relative position of the wafer 86 with respect to the heat sink in the carrier 26 can be adjusted so that at rotation speeds up to and including the transition speed, the wafer can be lifted completely off the upper surface 94 of the pedestal allowing thermal isolation of the wafer. The process takes place in a vacuum so that radiation is then the only heat loss mechanism. This allows the wafers to heat up during implantation resulting in much higher temperatures which can reduce the formation of lattice dislocations during implant. The higher temperatures that can be achieved are determined by the power of the ion beam applied to the wafer and the radiation losses from the wafer. After a critical implant dose and a predetermined high temperature is achieved, under the control of the speed controller 204, the speed of rotation of the implant wheel is increased to a speed in excess of the transition speed so that the wafer is moved into thermal contact with the heat sink in the pedestal 84 for the remaining implant dose. With the wafer in contact with the heat sink, the temperature of the wafer can be lowered which facilitates the prevention of premature exfoliation as the implant dose approaches the required dose for exfoliation. The temperature of the wafer can be lowered by conductive cooling through the thermally conductive material 88 on the upper surface 94 of the pedestal 84 and the cooling channels 90 in the pedestal 84. It may be possible to vary the amount of conductive cooling, when the wafer is in contact with the heat sink, by adjusting the rotation speed of the implant wheel under the control of the speed controller 204. This adjusts the centrifugal force exerted on the wafer which is pressing the wafer against the upper surface 94 of the pedestal 84 and can control the quality of thermal contact.

Different wafer lift structures can be contemplated. For example, each fence arm may have a center of mass located relative to the pivot point of the fence arm such that, when the implant wheel is at rest or is rotating at rotational speeds less than the transition speed, the line of action of the center mass due to gravity and centrifugal force acts relative to the pivot point so that the fence arm pivots to move the fence to the first position, and when the rotational speed of the implant wheel exceeds the transition speed, the line of action acts so that the fence arm pivots to move the fence to the second position.

Alternative wafer lift structures can be envisaged which may not require the speed of rotation to be varied in order to change the relative position of the wafer with respect to the heat sink in the carrier. For example, the wafer lift structure may comprise one or more actuators which can be operated to change the position of the wafer with respect to the heat sink at the appropriate time during implantation.

In summary, a wafer lift structure in accordance with the invention can adjust the thermal contact between a wafer and a heat sink in a carrier so that the temperature of the wafer during an ion implantation process can be controlled. An embodiment of the invention is arranged so that the position of the wafer relative to the heat sink can be adjusted by adjusting the rotation speed of the implant wheel. Thus, the present invention facilitates the control of bulk wafer temperature.

An embodiment of the invention uses a wafer lift structure that moves the wafer to a spaced apart position in which the wafer is spaced apart from the carrier. In this spaced apart position the wafer can be loaded and unloaded from the carrier. Thus, the same lift mechanism can be used for loading and unloading wafers and also for facilitating control of the wafer temperature.

Pin mechanisms for lifting a wafer during loading and unloading are known, however, these known pin mechanisms are not designed to lift the wafers during an ion implantation process while the implant wheel is rotating.

A variety of examples and embodiments have been provided for clarity and completeness. Other embodiments of the invention will be apparent to one of ordinary skill in the art when informed by the present specification. Detailed methods of and systems for implantation have been described herein, but any other methods and systems can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method of implanting ions into a substrate wafer comprising the steps of:
   mounting the substrate wafer onto a carrier containing a heat sink for removing heat from said wafer during an ion implantation process by thermal contact between said wafer and said heat sink;
   initiating the ion implantation process so that ions are implanted into said wafer mounted on the carrier;
   and during said ion implantation process selectively adjusting said thermal contact between said wafer and said heat sink, to control heat removal from said wafer;
   wherein said step of selectively adjusting said thermal contact comprises:
      pivotably mounting first and second fence arms on said wafer carrier;
      supporting a first edge portion of said wafer on said carrier by a first fence provided by said first fence arm at a first edge portion of said carrier;
      supporting a second edge portion of said wafer on said carrier by a second fence provided by said second fence arm at a second edge portion of said carrier;
      further supporting by said first and second fences an underside of said wafer facing said heat sink at said first and second edge portions; and
      pivoting each of said first and second fence arms on said wafer carrier to provide movement of the respective said fence transverse to a plane of the wafer, whereby to selectively adjust the relative position of said wafer on said carrier and said heat sink, between a spaced apart position and a thermal contact position.

2. A method of implanting as claimed in claim 1, wherein said ion implantation process is operative to deliver an average power to said wafer of at least 50 watts.

3. A method of implanting as claimed in claim 2, wherein said ion implantation process is operative to deliver an average power to said wafer of at least 200 watts.

4. An ion implantation apparatus for implanting ions into a substrate wafer comprising:
   a wafer carrier containing a heat sink for removing heat from a wafer on said carrier during an ion implantation process by thermal contact between said wafer and said heat sink;
   and a wafer lift structure mounted on said wafer carrier and operable during said ion implantation process while ions are being implanted to adjust said thermal contact between said wafer and said heat sink to control heat removal from said wafer;
   wherein said lift structure comprises first and second fence arms mounted on said wafer carrier, said first fence arm providing a first fence at a first edge portion of said carrier to support a corresponding first edge portion of said wafer on said carrier and said second fence arm providing a second fence at a second edge portion of said carrier opposed to said first edge portion to support a corresponding second edge portion of said wafer on said carrier, said first and second fences further supporting at said first and second edge portions of said carrier an underside of said wafer facing said heat sink; and
   wherein each of said first and second fence arms is pivoted on said wafer carrier to provide movement of the respective said fence transverse to the plane of a wafer on said carrier to provide movement adjusting said thermal contact.

5. The ion implantation apparatus as claimed in claim 4, wherein said apparatus is operative during an implant process to deliver an average power to said wafer on said carrier of at least 50 watts.

6. The ion implantation apparatus as claimed in claim 5, wherein said apparatus is operative during an implant process to deliver an average power to said wafer on said carrier of at least 200 watts.

7. The ion implantation apparatus as claimed in claim 4, wherein said wafer lift structure is operable to move said wafer on said carrier relative to said heat sink between a spaced apart position and a thermal contact position.

8. An ion implantation apparatus for implanting ions into planar substrate wafers, comprising:
   an implant wheel mounted for rotation about a wheel axis;
   a plurality of wafer carriers distributed about a periphery of said implant wheel;
   a respective heat sink in each said wafer carrier for removing heat from a wafer on said carrier during an ion implantation process by thermal contact between said wafer and said heat sink;
   and a respective wafer lift structure on each said wafer carrier which is movable between a first position with said wafer supported spaced away from said heat sink and a second position with said wafer in contact with said heat sink;
   wherein each said lift structure is operable to move between said first and second portions when said implant wheel is rotating;
   wherein each said lift structure comprises inner and outer fence arms mounted on said respective wafer carrier, said inner fence arm providing an inner fence at a radially inner edge of said carrier relative to said wheel axis to support an inner edge of said wafer on said carrier and said outer fence arm providing an outer fence at a radially outer edge of said carrier to support an outer edge of said wafer on said carrier, said inner and outer fences further supporting at said inner and outer edges an underside of said wafer facing said heat sink; and
   wherein each of said inner and outer fence arms is pivoted on said wafer carrier to provide movement of the respective said fence transverse to the plane of a wafer on said carrier to provide movement between said first and second positions.

9. The ion implantation apparatus as claimed in claim 8, wherein said wafer carriers are each adapted to support respective said wafers canted by a predetermined cant angle inwards towards said wheel axis so that, when said implant wheel rotates about said axis, a centrifugal force urges each said wafer on a respective said carrier towards said respective heat sink.

10. The ion implantation apparatus as claimed in claim 9, wherein a first part of said ion implantation process is performed with said wafer in said spaced apart position.

11. The ion implantation apparatus as claimed in claim 9, wherein said wafer is planar and said carrier is rotated during said ion implantation process about an axis, the axis being angled relative to a normal to said wafer on said carrier and the axis being spaced from said wafer so that a centrifugal force is exerted on said wafer which has a component urging said wafer towards said heat sink.

12. The ion implantation apparatus as claimed in claim 11, wherein said wafer is urged on said carrier towards said spaced apart position from said thermal contact position by an urging force which exceeds said component of said centrifugal force at rotational speeds of said carrier about said axis up to a transition speed, and said relative position of said wafer and said heat sink is selectively adjusted between said spaced apart position and said thermal contact position by adjusting said rotational speed during said ion implantation process between speeds below and above said transition speed.

13. The ion implantation apparatus as claimed in claim 12, wherein said urging force reduces as said rotational speed increases.

14. The ion implantation apparatus as claimed in claim 9, wherein said fence arms are pivoted such that centrifugal force from rotation of said implant wheel acts on said fence arms to urge the respective said fences towards said second position.

15. The ion implantation apparatus as claimed in claim 14, wherein each said lift structure includes at least one spring urging said fence arms towards said first position.

16. The ion implantation apparatus as claimed in claim 8, wherein each said lift structure is responsive to centrifugal force to move between said first and second positions as the speed of rotation of said implant wheel is varied.

17. The ion implantation apparatus as claimed in claim 16, wherein each said lift structure is adapted to move said respective lift structure to bring said wafer into contact with said heat sink when said implant wheel is rotating at speeds in excess of a transition speed.

18. The ion implantation apparatus as claimed in claim 17, further comprising a drive motor for the implant wheel and a speed controller for said drive motor, wherein said speed controller is arranged to control said drive motor to rotate said implant wheel while implanting ions into said wafers on said carriers at rotation speeds in excess of a minimum process rotation speed, and wherein each said lift structure is adapted such that said transition speed of the implant wheel is higher than said minimum process rotation speed.

* * * * *